United States Patent [19]
Sigmon et al.

[11] Patent Number: 6,028,485
[45] Date of Patent: Feb. 22, 2000

[54] POWER AMPLIFICATION APPARATUS AND METHOD THEREFOR

[75] Inventors: Bernard Eugene Sigmon, Gilbert; Ronald Gene Myers, Scottsdale, both of Ariz.

[73] Assignee: Motorola, Inc., Schaumburg, Ill.

[21] Appl. No.: 09/128,600

[22] Filed: Aug. 3, 1998

[51] Int. Cl.[7] .................................. H03F 3/68; H03F 3/60
[52] U.S. Cl. ........................................... 330/295; 330/286
[58] Field of Search ................................ 330/124 R, 295, 330/302, 286; 333/116, 128, 161

[56] References Cited

U.S. PATENT DOCUMENTS

| | | | |
|---|---|---|---|
| 5,017,888 | 5/1991 | Meinzer | 330/124 R X |
| 5,028,880 | 7/1991 | Sakai | 330/124 R X |
| 5,420,541 | 5/1995 | Upton et al. | 330/286 |
| 5,541,554 | 7/1996 | Stengel et al. | 330/295 X |
| 5,568,086 | 10/1996 | Schuss et al. | 330/124 R |
| 5,757,229 | 5/1998 | Mitzlaff | 330/124 R |

*Primary Examiner*—Steven J. Mottola
*Attorney, Agent, or Firm*—Dana B. LeMoine; James E. Klekotka

[57] ABSTRACT

A method and apparatus for efficiently amplifying input signals includes multiple amplifiers (20, 30). Each amplifier receives a signal from a power divider (12) where the input signal is split with substantially equal phase. Each amplifier drives a load (40) through a parallel coupled line pair (26, 36). The parallel coupled line pairs are preferably implemented in micro-strip or strip line technology. Each amplifier includes gate bias inputs (24, 34) and drain bias inputs (22, 32). The gate bias inputs can be biased equally and the drain bias inputs can be biased equally, resulting in a parallel, power combined, amplifier configuration. Alternately, the drain bias inputs can be staggered, or the gate bias inputs can be staggered to increase efficiency.

20 Claims, 3 Drawing Sheets

6,028,485

POWER AMPLIFICATION APPARATUS AND METHOD THEREFOR

FIELD OF THE INVENTION

This invention relates in general to power amplifiers, and in particular, to high efficiency power amplifiers.

BACKGROUND OF THE INVENTION

Modern communications systems continue to place ever-increasing performance demands on communications devices. Handheld communications devices in particular are subject to increasingly rigorous demands of smaller size and increased efficiency. At the same time, consumers expect these devices to have a continuously growing set of features.

Consumers expect phones to be smaller, lighter, and to have longer talk times. Unfortunately, these desirable features often represent competing demands to be satisfied by the phone designer. For example, the simplest method of increasing talk time is to increase battery size, but this works against the goal of smaller size. One method of achieving increased talk time without increasing overall size is to make the device more efficient. This way, talk time as well as other desirable features can be enhanced without increasing the battery size.

Because the power amplifier is by far the largest consumer of power in handheld communications devices, increasing the efficiency of the power amplifier is very desirable. Increased power amplifier efficiency results in the ability to make smaller phones that have more features, including increased talk time. The demand for higher performance communications devices, and in particular, smaller phones with increased talk time, presents the phone designer with a difficult problem: how to design a power amplifier capable of operating efficiently over a wide dynamic range.

Accordingly, there is a significant need for an efficient power amplifier capable of maintaining high efficiency while operating linearly over a wid dynamic range.

DETAILED DESCRIPTION OF THE DRAWINGS

The method and apparatus of the present invention provides an advantageous means for efficiently amplifying a signal having a large dynamic range. Multiple amplifiers are utilized, and each amplifier drives an impedance inverting, 90 degree phase shifter. The outputs of the 90 degree phase shifters are connected to create the amplified output signal.

In one embodiment, drain biases of the parallel amplifiers are optionally staggered, so that each parallel amplifier has a different supply voltage. The resulting staggered operation of the amplifiers results in a subset of the amplifiers amplifying the low power portion of the input signal, and a different subset of the amplifiers amplifying the higher power portion of the input signal.

In another embodiment, the parallel amplifiers have their gate biases staggered, so that each amplifier begins to operate at a different input power level. The resulting staggered operation of the amplifiers results in a subset of the amplifiers amplifying the low power portion of the input signal, and a different subset of the amplifiers amplifying the higher power portion of the input signal.

In yet another embodiment, the drain biases of the amplifiers are set equally, and the gate biases are set equally, so that they all operate on the entire dynamic range of the input signal.

Figure 1:
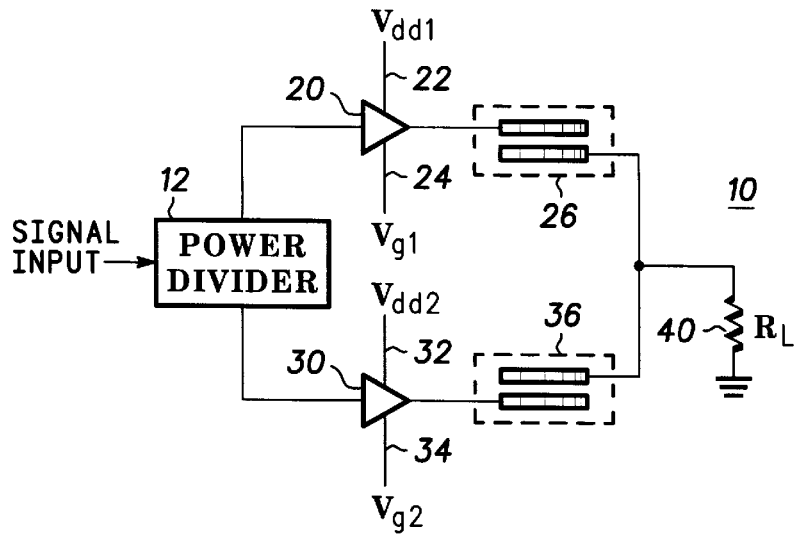
FIG. 1 shows a diagram of an amplifier circuit in accordance with a preferred embodiment of the present invention.

Turning now to the drawings in which like reference characters indicate corresponding elements throughout the several views, attention is first directed to FIG. 1. FIG. 1 shows a diagram of an amplifier circuit in accordance with a preferred embodiment of the present invention. Amplifier circuit 10 includes power divider 12, amplifiers 20 and 30, impedance inverters 26 and 36, and load 40. Power divider 12 preferably divides the input signal equally with little or no phase difference between the outputs. The outputs of power divider 12 drive amplifiers 20 and 30.

Amplifier 20 includes gate bias input 24 and drain bias input 22. Amplifier 30 includes gate bias input 34 and drain bias input 32. In a preferred embodiment, amplifiers 20 and 30 are Field Effect Transistors (FET) amplifiers. Drain bias input 22 and drain bias input 32 are equivalent to power supply inputs for FET amplifiers. Gate bias inputs 24 and 34 are used to bias amplifiers 20 and 30, and set the input power range over which they operate. In alternate embodiments, amplifiers 20 and 30 are not FET amplifiers. In one alternate embodiment, amplifiers 20 and 30 are implemented with bipolar transistors. In this alternate embodiment, drain bias input 22 and drain bias input 32 correspond to inputs used to power the bipolar transistor amplifier, which is usually at the collector. Also in this alternate embodiment, drain bias input 24 and gate bias input 34 correspond to inputs used to DC bias the base of the bipolar transistor.

Amplifier 20 drives impedance inverter 26. Impedance inverter 26 is preferably composed of parallel coupled lines implemented in either micro-strip or strip line technology. Impedance inverter 26, when composed of parallel coupled lines, performs impedance inversion, impedance matching, 90 degree phase shifting, and DC blocking. Amplifier 30 drives impedance inverter 36. Impedance inverter 36 is also preferably composed of parallel coupled lines, and preferably has the same properties as impedance inverter 26. The output of impedance inverter 26 and the output of impedance inverter 36 are brought together to drive the load. In amplifier circuit 10, load 40 is represented by a resistor at the output.

Parallel coupled lines are advantageous in part because DC blocking capacitors, and their associated losses, are eliminated. As a result, the efficiency is increased. Other advantages include, but are not limited to, a shorter signal path length than exists in a conventional transformer, and the ability to fabricate the parallel coupled lines directly on a circuit card.

In operation, an input signal is received by power divider 12 where it is split into two signals with substantially equal phase. The signals output from power divider 12 are input to amplifier 20 and amplifier 30. Amplifier 20 and amplifier 30 each amplify a portion of the input signal, and output amplified signals. The amplified signal from amplifier 20 passes through impedance inverter 26, and the amplified signal from amplifier 30 passes through impedance inverter 36. Because impedance inverter 26 and impedance inverter 36 introduce the same amount of phase shift, the resulting signals combine in phase at the load.

In a first embodiment, drain bias input 22 of amplifier 20 and drain bias input 32 of amplifier 30 are set to substantially the same voltage value. Also in this first embodiment, gate bias input 24 of amplifier 20 and gate bias input 34 of amplifier 30 are set to substantially the same voltage value. In this first embodiment, with amplifier 20 and amplifier 30 biased substantially the same, amplifier 20 and amplifier 30 operate substantially the same for any given input signal level. Both amplifier 20 and amplifier 30 preferably contribute substantially equal amounts of power which are combined in phase at the load.

In a second embodiment, amplifier 20 amplifies a first portion of the input signal, and amplifier 30 amplifies a second portion of the input signal. The first portion of the input signal amplified by amplifier 20 is the low power portion. The second portion of the input signal amplified by amplifier 30 is the higher power portion. This is achieved by setting drain bias input 22 of amplifier 20 to a lower voltage level than drain bias input 32 of amplifier 30. At low input signal levels amplifier 20 is biased on, and amplifier 30 is biased off. Amplifier 20 amplifies the low power portion of the input signal, and drives the load through impedance inverter 26. When amplifier 30 is biased off at low input signal levels, the output impedance of amplifier 30 is low. Because impedance inverter 36 transforms the output impedance of amplifier 30 from a low value to a high value, impedance inverter 36 and amplifier 30 do not load the output, and power is efficiently delivered through impedance inverter 26 to the load.

Still referring to the second embodiment where drain bias input 22 and drain bias input 32 are staggered, amplifier 30 will begin to turn on as the input signal level increases. Drain bias input 32 is preferably set such that amplifier 30 begins to turn on as amplifier 20 begins to saturate. As amplifier 30 begins to turn on, power is delivered from amplifier 30 through impedance inverter 36 to the load. The output impedance of amplifier 30, which was very low prior to amplifier 30 turning on, begins to increase as an amplifier 30 begins to turn on. At the same time that the output impedance of amplifier 30 is increasing, the output impedance of amplifier 20 is decreasing. When both amplifier 20 and amplifier 30 are saturated, the output impedance of the two amplifiers converge to substantially the same value, and both amplifiers deliver their full amount of power to the load.

When one amplifier is biased to amplify a lower power portion of an input signal, that amplifier is termed a "carrier" amplifier. In contrast, when an amplifier is biased to amplify a higher power portion of an input signal, that amplifier is termed a "peaking" amplifier.

As is explained more fully with reference to FIG. 3 below, the staggered operation of the second embodiment provides substantial improvements in efficiency. For low input signal levels, amplifier 20 operates linearly, and amplifier 30 is off. In this operating range, the efficiency of amplifier circuit 10 is substantially equal to the efficiency of amplifier 20. As amplifier 20 begins to saturate, amplifier 20 begins to exhibit nonlinear characteristics; however, amplifier 20 also begins to become more efficient. Amplifier 30 begins to turn on, resulting in continued linear behavior, but in this operating region, the efficiency of amplifier circuit 10 is considerably greater than the efficiency of amplifier 30 alone.

In a third embodiment, the gate biases are staggered. For example, gate bias input 24 of amplifier 20 can be set to a voltage different than gate bias input 34 of amplifier 30. When gate bias input 24 is biased different than gate bias input 34, amplifier 20 amplifies the lower power portion of the input signal, and amplifier 30 amplifies the higher power portion of the input signal. Depending on the type of active FET used, for example, a depletion mode N channel FET, or an enhancement mode P channel FET, gate bias input 24 may be set to a voltage above or below gate bias input 34. What is important is that gate bias input 24 is biased such that amplifier 20 amplifies the portion of the input signal which has lower amplitudes, and that gate bias input 34 is biased such that amplifier 30 amplifies the portion of the input signal which has higher amplitudes. The operation of the third embodiment is much like the operation of the second embodiment in that as amplifier 20 saturates, amplifier 30 begins to turn on.

In a fourth embodiment, both the drain biases and the gate biases are staggered. This embodiment is advantageous in many ways. One example is when adjustments are desired after the drain biases have been staggered. By combining the second and third embodiments above to arrive at the fourth embodiment, a designer can advantageously use standard power supply values for the drain biases, and make adjustments to the operation of amplifier circuit 10 by modifying the gate biases.

Amplifier circuit 10 has many advantages. By setting all drain biases equal, and setting all gate ibiases equal, amplifier circuit 10 functions as multiple paralleled, power combining, amplifiers. By staggering either the drain biases or the gate biases or both, staggered operation of multiple amplifiers is achieved, which results in increased efficiency.

Figure 2:
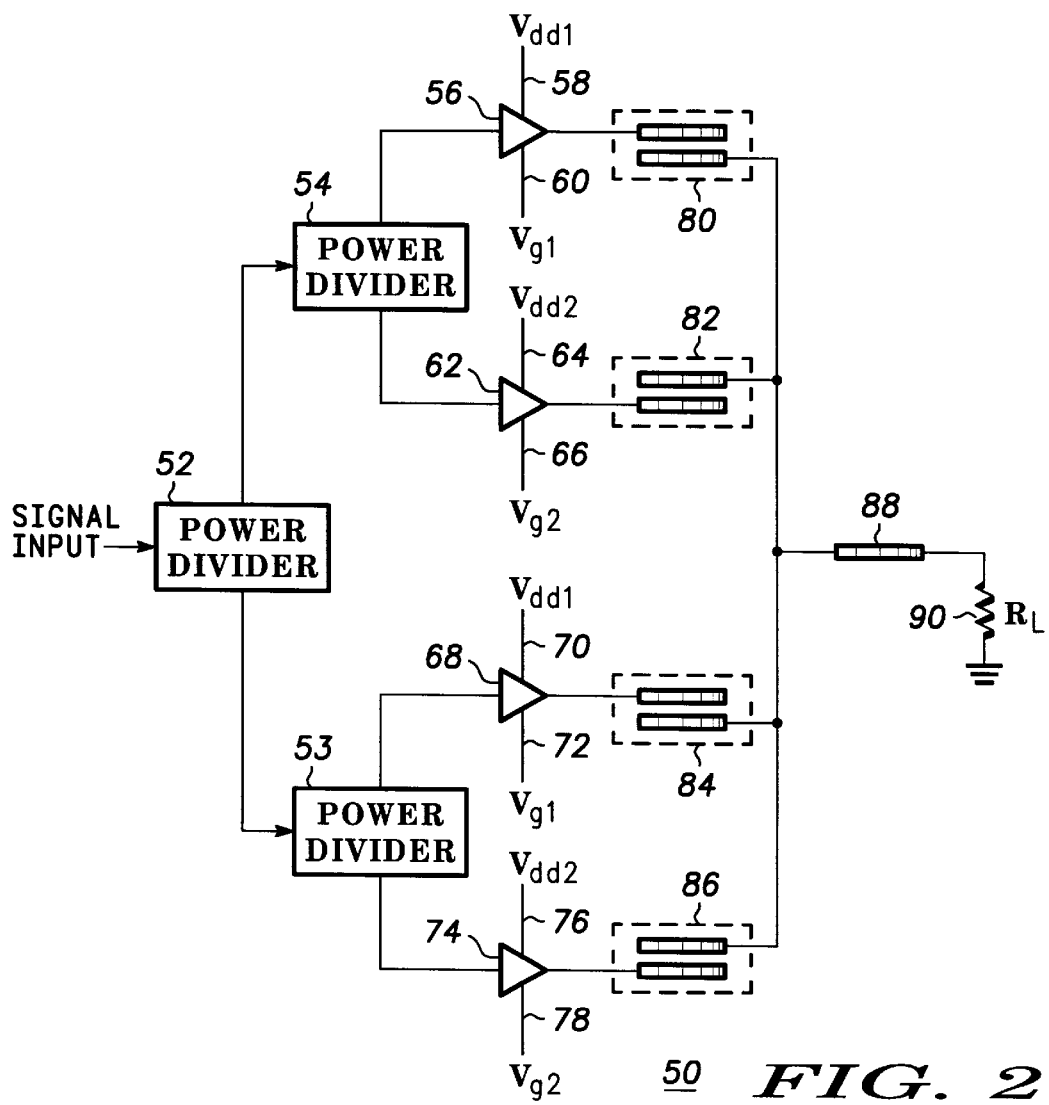
FIG. 2 shows a diagram of a second amplifier circuit in accordance with a preferred embodiment of the present invention.

FIG. 2 shows a diagram of a second amplifier circuit in accordance with a preferred embodiment of the present invention. Amplifier circuit 50 is a scaled-up version of amplifier 10 (FIG. 1). Amplifier circuit 50 includes four amplifiers, in contrast to the two amplifiers of amplifier circuit 10 (FIG. 1).

Amplifier circuit 50 includes power dividers 52, 53, and 54; amplifiers 56, 62, 68, and 74; parallel coupled lines 80, 82, 84, and 86; impedance match circuit 88, and load 90. Amplifier 56 includes drain bias input 58 and gate bias input 60. Amplifier 62 includes drain bias input 64 and gate bias input 66. Amplifier 68 includes drain bias input 70 and gate bias input 72. Amplifier 74 includes drain bias input 76 and gate bias input 78.

In a first embodiment, all drain biases are set to substantially the same voltage, and all of the gate bias inputs are biased substantially equally. In this embodiment, like the first embodiment of amplifier circuit 10 (FIG. 1), all amplifiers operate as parallel, power combined, amplifiers.

In a second embodiment, the drain biases are staggered. For example, drain bias input 58 can be set He to a voltage less than all other drain biases in amplifier circuit 50. Drain bias input 76 can be set to a voltage value higher than that of drain bias input 58, but less than that of the remaining drain bias inputs. Also for example, drain bias input 64 and drain bias input 70 can be set to voltage values higher than all the rest. In this exemplary embodiment, amplifier 56 amplifies the lowest power portion of the input signal, amplifier 74 amplifies the next higher power portion of the input signal, and amplifiers 62 and 68 amplify the highest power portion of the input signal.

Amplifier circuit 50 exhibits its highest efficiency when amplifiers are off, or when operating amplifiers are in saturation. Accordingly, it is advantageous to bias the drain bias inputs of amplifier circuit 50 such that high efficiency is obtained at a power level where most operation occurs. Depending on the desired operation of amplifier circuit 50, a designer may designate any number of amplifiers to be carrier amplifiers, and any number of amplifiers to be peaking amplifiers. For example, amplifiers 56 and 74 can be designated as carrier amplifiers, and their corresponding drain bias inputs may be set to voltages below a given threshold. Amplifiers 62 and 68 can be designated as peaking amplifiers, and their corresponding drain bias inputs may be set to voltages above the threshold. Each of the carrier amplifiers can have their drain bias inputs set to equal voltages, and each of the peaking amplifiers can have their corresponding drain bias inputs set to equal voltages, but this is not a limitation of the present invention.

In a third embodiment, the gate biases are staggered. When the gate biases are staggered, it remains convenient for the purposes of explanation to label one or more amplifiers as carrier amplifiers, and to label one or more amplifiers as peaking amplifiers. The operation of amplifier circuit 50 when the gate biases are staggered is analogous to the operation in the second embodiment previously described.

In a fourth embodiment, both the drain biases and the gate biases are staggered. This operation is analogous to the fourth embodiment of amplifier circuit 10 (FIG. 1).

Amplifier circuit 50 includes impedance match circuit 88. Impedance match circuit 88 functions to match the impedance of the multiple parallel coupled line pairs to the load. For example, if the impedance of each parallel coupled line pair is 50 ohms, and load 90 is also 50 ohms, impedance match circuit 88 provides a four to one impedance conversion. Also for example, if the impedance of each parallel coupled line pair is 200 ohms, and the impedance of load 90 is also 50 ohms, then impedance match circuit 88 can be omitted.

In the exemplary embodiment of amplifier circuit 50 as shown in FIG. 2, amplifiers 56, 62, 68, and 74 are FET amplifiers. Amplifiers based on other types of active devices, such as bipolar transistors and Metal Oxide Semiconductor Field Effect Transistors (MOSFET) transistors can also be used, and are intended to be within the scope of the present invention.

Amplifier circuit 50 is depicted in FIG. 2 as having four FET amplifiers configured in parallel. This is not a limitation of the present invention. Any number of amplifiers can be included while still practicing the present invention.

Amplifier circuit 50 has many advantages. Depending on how the drain bias voltages are set, and how the gate bias voltages are set, amplifier circuit 50 can advantageously power combine the output of all the amplifiers at all signal levels, or can have each amplifier contribute output power when the input signal is within a specified power region.

Figure 3:
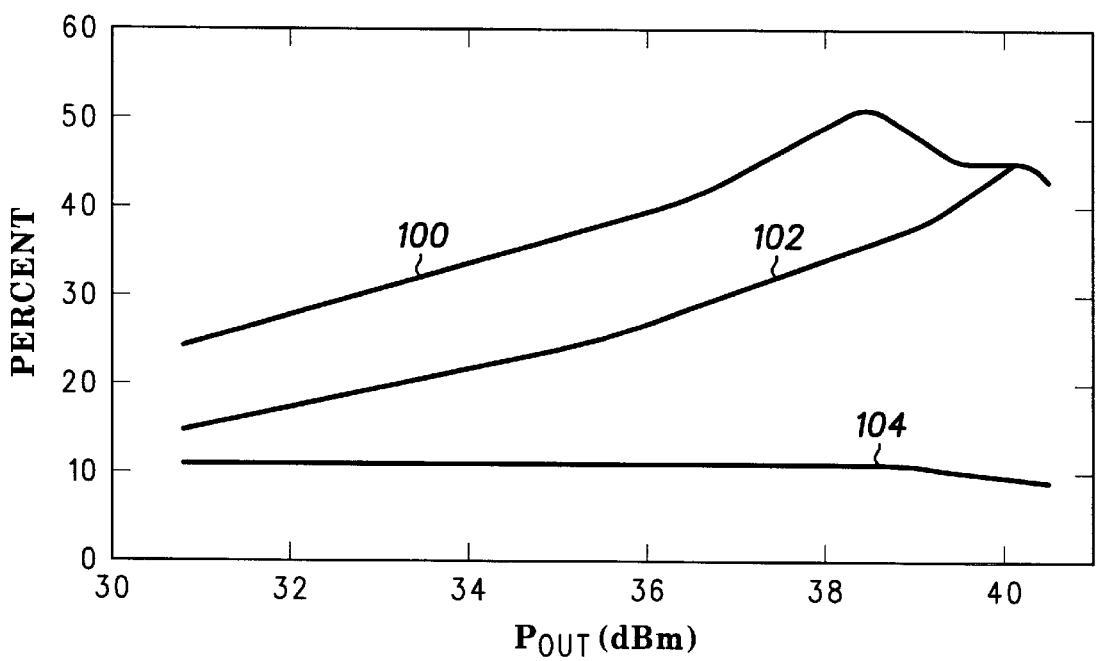
FIG. 3 shows a graph depicting the measured efficiency of the amplifier of FIG. 2 in accordance with a preferred embodiment of the present invention.

FIG. 3 shows a graph depicting the measured efficiency of the amplifier of FIG. 2 in accordance with a preferred embodiment of the present invention. The data shown in FIG. 3 includes measured efficiency 100, measured gain 104, and class-B efficiency 102. Measured efficiency 100 and measured gain 104 were measured from a prototype of amplifier circuit 50 with staggered drain voltages. Amplifier 56 and amplifier 74 were configured as carrier amplifiers, and amplifier 62 and amplifier 68 were configured as peaking amplifiers. Drain bias input 58 was set to three volts, drain bias input 76 was set to six volts, and both drain bias input 64 and drain bias input 70 were set to nine volts. The resulting gain and measured efficiency are presented in FIG. 3.

As can be seen in FIG. 3, the measured efficiency of amplifiers circuit 50 is approximately 10 percent greater than the efficiency of a class-B amplifier over most of the dynamic range. In addition, the gain of amplifier circuit 50 is advantageously flat. Measured gain 104 is overlayed onto the efficiency graph. The vertical axis is labeled in percent for the purpose of interpreting measured efficiency 100 and class-B efficiency 102; however, the numbers on the vertical axis also represent gain values in dB for the purpose of interpreting measured gain 104.

Figure 4:
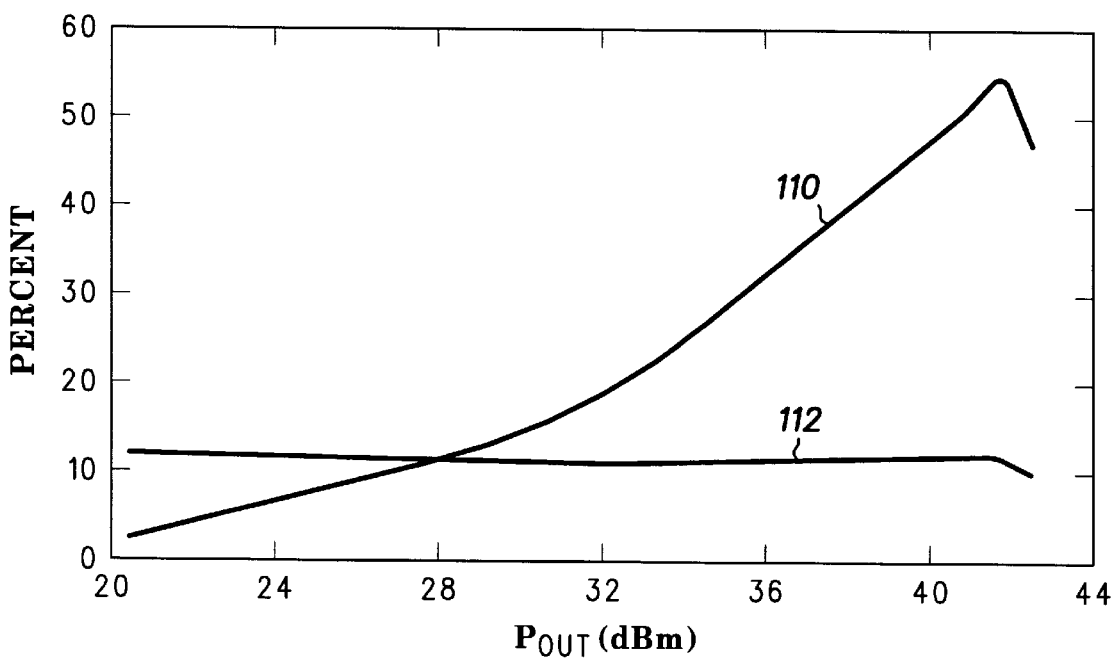
FIG. 4 shows a second graph depicting the measured efficiency of the amplifier of FIG. 2 in accordance with a preferred embodiment of the present invention.

FIG. 4 shows a second graph depicting the measured efficiency of the amplifier of FIG. 2 in accordance with a preferred embodiment of the present invention. Measured efficiency 110 and gain 112 were measured from a prototype of amplifier circuit 50 with all drain biases set to substantially equal voltages, and all gate biases biased substantially equally. Amplifiers 56, 62, 68, and 74 were biased as class-AB amplifiers with a drain bias value of eight volts. The vertical axis is labeled in percent for the purpose of interpreting measured efficiency 110; however, the numbers on the vertical axis also represent gain values in dB for the purpose of interpreting gain 112.

The measured data as presented in FIGS. 3 and 4 demonstrate the versatility of the method and apparatus of the present invention. With a single hardware circuit, multiple amplifier topologies can effectively be created by simply modifying drain bias values and gate bias values.

Figure 5:
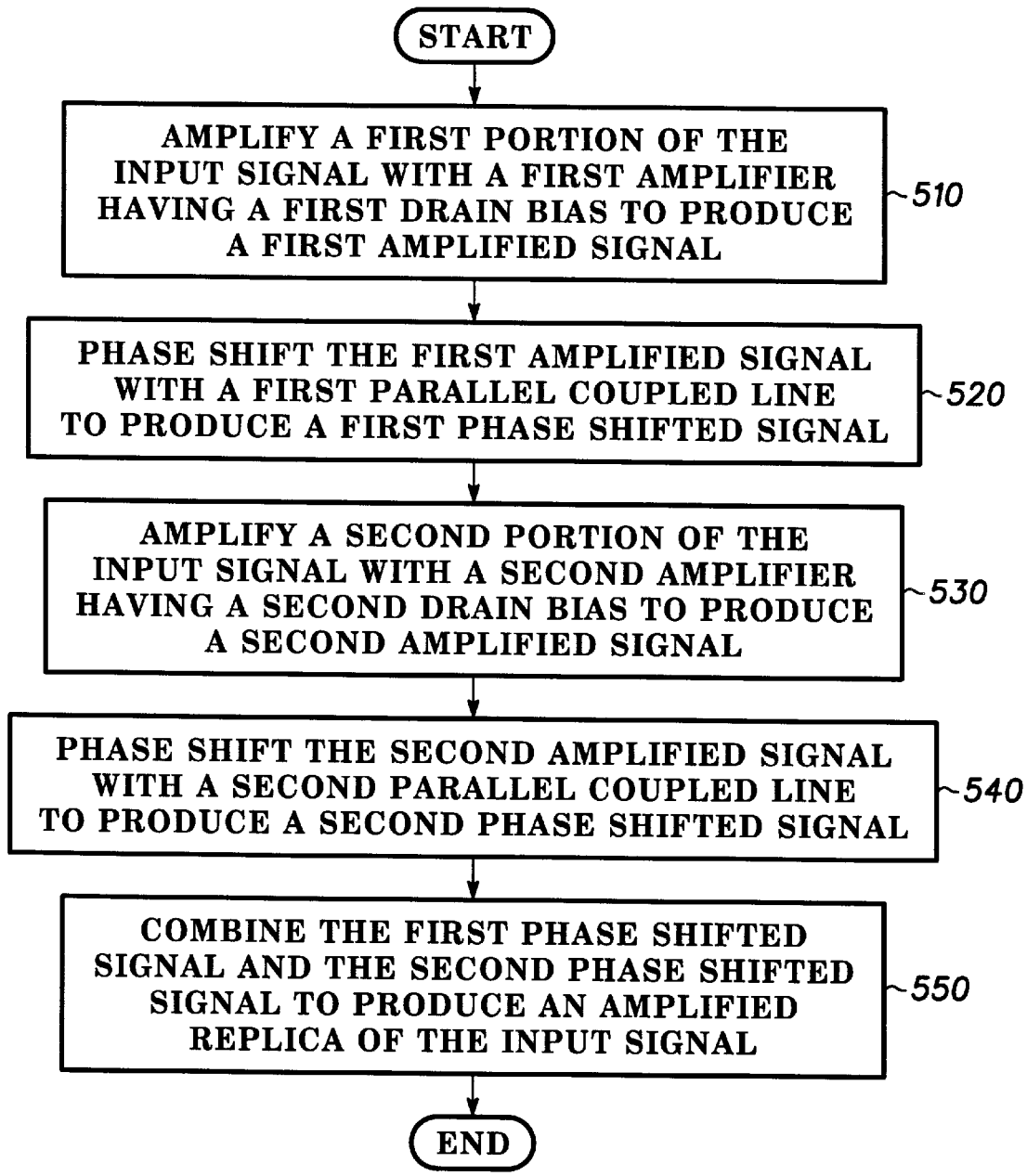
FIG. 5 shows a flowchart for a method of amplifying a signal in accordance with a preferred embodiment of the present invention.

FIG. 5 shows a flowchart for a method of amplifying a signal in accordance with a preferred embodiment of the present invention. Method 500 begins with step 510 when a first portion of an input signal is amplified with a first amplifier. The first portion of the input signal is preferably a lower power portion of the input signal. When the first portion of the input signal is a lower power portion, the first amplifier amplifies that portion of the input signal which has lower signal amplitudes. The first amplifier has a first drain bias. A first amplified signal is produced in step 510. In step 520, the first amplified signal is phase shifted with a first parallel coupled line, resulting in a first phase shifted signal. In step 530, a second portion of the input signal is amplified with a second amplifier. The second portion of the input signal is preferably a higher power portion of the input signal. When a second portion is the higher power portion of the input signal, the second amplifier amplifies that portion of the input signal which has higher signal amplitudes. The second amplifier has a second drain bias. The drain bias of the second amplifier is preferably set to a higher voltage than the drain bias of the first amplifier. A second amplified signal is produced in step 530. In step 540, the second amplified signal is phase shifted using a second parallel coupled line, resulting in a second phase shifted signal. In step 550, the first phase shifted signal and the second phase shifted signal are combined to produce in amplified replica of the input signal.

In summary, the method and apparatus of the present invention provides an advantageous means for amplifying an input signal using a configurable amplifier architecture. A single amplifier architecture can combined multiple amplifiers over the entire dynamic range, or staggered over the entire dynamic range as a function of the bias applied to the amplifiers.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An amplifier circuit comprising:

an input and an output;

a first amplifier having a first gate bias, a first drain bias, a first signal input coupled to the input of the amplifier circuit, and a first signal output, said first amplifier comprising means for amplifying a lower power portion of a signal;

a second amplifier having a second gate bias, a second drain bias, a second signal input coupled to the input of the amplifier circuit, and a second signal output, said second amplifier comprising means for amplifying a higher power portion of said signal;

a first impedance inverter coupled between the first output of the first amplifier and the output of the amplifier circuit; and a second impedance inverter coupled between the second output of the second amplifier and the output of the amplifier circuit.

2. The amplifier circuit of claim 1 wherein the first impedance inverter comprises parallel coupled line sections, and the second impedance inverter comprises parallel coupled line sections.

3. The amplifier circuit of claim 2 wherein:

said first gate bias and said second gate bias are biased substantially the same;

the first drain bias is set to a first voltage; and the second drain bias is set to a second voltage, wherein the first voltage and the second voltage are not the same voltage.

4. The amplifier circuit of claim 2 wherein:

said first gate bias and said second gate bias are biased differently;

the first drain bias is set to a first voltage; and the second drain bias is set to a second voltage, wherein the first voltage and the second voltage are substantially the same voltage.

5. The amplifier circuit of claim 2 wherein:

said first gate bias and said second gate bias are biased substantially the same;

the first drain bias is set to a first voltage; and the second drain bias is set to a second voltage, wherein the first voltage and the second voltage are substantially the same voltage.

6. The amplifier circuit of claim 2 further comprising a power divider coupled between the input of the amplifier and the first input of the first amplifier, and coupled between the input of the amplifier circuit and the second input of the second amplifier, wherein the power divider divides an input signal present at the input of the amplifier circuit into two signals having substantially the same phase.

7. An amplifier circuit comprising:

an input and an output;

a first amplifier having a first gate bias, a first drain bias, a first signal input coupled to the input of the amplifier circuit, and a first signal output;

a second amplifier having a second gate bias, a second drain bias, a second signal input coupled to the input of the amplifier circuit, and a second signal output;

a third amplifier having a third gate bias, a third drain bias, a third signal input coupled to the input of the amplifier circuit, and a third signal output;

a fourth amplifier having a fourth gate bias, a fourth drain bias, a fourth signal input coupled to the input of the amplifier circuit, and a fourth signal output;

a first impedance inverter coupled between the first output of the first amplifier and the output of the amplifier circuit;

a second impedance inverter coupled between the second output of the second amplifier and the output of the amplifier circuit;

a third impedance inverter coupled between the third output of the third amplifier and the output of the amplifier circuit; and a fourth impedance inverter coupled between the fourth output of the fourth amplifier and the output of the amplifier circuit.

8. The amplifier circuit of claim 7 wherein the first impedance inverter comprises parallel coupled line sections, the second impedance inverter comprises parallel coupled line sections, the third impedance inverter comprises parallel coupled line sections, and the fourth impedance inverter comprises parallel coupled line sections.

9. The amplifier circuit of claim 8 wherein:

said first gate bias, said second gate bias, said third gate bias, and said fourth gate bias are biased substantially the same.

10. The amplifier of claim 9 wherein the first amplifier and the second amplifier are carrier amplifiers, the third amplifier and the fourth amplifier are peaking amplifiers, and the drain biases of the peaking amplifiers are set to higher voltages than the drain biases of the carrier amplifiers.

11. The amplifier of claim 10 wherein:

the drain biases of the carrier amplifiers are set to different voltages; and the drain biases of the peaking amplifiers are set to substantially the same voltage.

12. The amplifier of claim 10 wherein:

the drain biases of the peaking amplifiers are set to different voltages; and the drain biases of the carrier amplifiers are set to substantially the same voltage.

13. The amplifier of claim 10 wherein:

the drain biases of the carrier amplifiers are set to substantially the same voltage; and the drain biases of the peaking amplifiers are set to substantially the same voltage.

14. The amplifier of claim 9 wherein the first drain bias, the second drain bias, the third drain bias, and the fourth drain bias are all set to substantially the same voltage.

15. The amplifier of claim 8 wherein the first drain bias, the second drain bias, the third drain bias, and the fourth drain bias are all set to substantially the same voltage.

16. The amplifier of claim 15 wherein the first amplifier and the second amplifier are carrier amplifiers, the third amplifier and the fourth amplifier are peaking amplifiers, and the gate biases of the peaking amplifiers are set to voltages different than the gate biases of the carrier amplifiers such that the peaking amplifiers turn on at higher input signal power levels than the carrier amplifiers.

17. The amplifier of claim 16 wherein:

the gate biases of the carrier amplifiers are biased differently; and the gate biases of the peaking amplifiers are biased substantially the same.

18. The amplifier of claim 16 wherein:

the gate biases of the peaking amplifiers are biased differently; and the gate biases of the carrier amplifiers are biased substantially the same.

19. The amplifier of claim 16 wherein:

the gate biases of the carrier amplifiers are biased substantially the same; and the gate biases of the peaking amplifiers are biased substantially the same.

20. A method of amplifying an input signal, said method comprising the steps of:

amplifying a first portion of said input signal with a first amplifier having a first drain bias, thereby producing a first amplified signal;

phase shifting the first amplified signal with a first parallel coupled line, thereby producing a first phase shifted signal;

amplifying a second portion of said input signal with a second amplifier having a second drain bias, wherein the second drain bias is set to a higher voltage than the first drain bias, thereby producing a second amplified signal;

phase shifting the second amplified signal with a second parallel coupled line, thereby producing a second phase shifted signal; and combining the first phase shifted signal and the second phase shifted signal to produce an amplified replica of the input signal.

* * * * *